(12) United States Patent
Talreja

(10) Patent No.: US 6,587,373 B2
(45) Date of Patent: *Jul. 1, 2003

(54) MULTILEVEL CELL MEMORY ARCHITECTURE

(75) Inventor: Sanjay S. Talreja, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/266,779

(22) Filed: Oct. 8, 2002

(65) Prior Publication Data

US 2003/0031050 A1 Feb. 13, 2003

Related U.S. Application Data

(63) Continuation of application No. 09/883,803, filed on Jun. 18, 2001, now Pat. No. 6,483,743.

(51) Int. Cl.[7] .............................................. G11C 16/04
(52) U.S. Cl. ............................ 365/185.03; 365/185.05; 365/185.18
(58) Field of Search ........................ 365/185.03, 185.05, 365/185.18

(56) References Cited

U.S. PATENT DOCUMENTS

| | | | | |
|---|---|---|---|---|
| 5,574,879 A | * | 11/1996 | Wells et al. | 711/100 |
| 5,754,566 A | * | 5/1998 | Christopherson et al. | 714/773 |
| 5,937,423 A | * | 8/1999 | Robinson | 711/103 |
| 6,023,781 A | * | 2/2000 | Hazama | 714/773 |
| 6,195,284 B1 | * | 2/2001 | Egawa | 365/185.03 |
| 6,424,566 B1 | * | 7/2002 | Parker | 365/185.03 |

* cited by examiner

Primary Examiner—Son T. Dinh
(74) Attorney, Agent, or Firm—Trop, Pruner & Hu, P.C.

(57) ABSTRACT

A multilevel cell memory may use an architecture in which bits from different words are stored in the same multilevel memory cell. This may improve access time because it is not necessary to sense both cells before the word can be outputted. Therefore, the access time may be improved by removing a serial element from the access chain.

4 Claims, 4 Drawing Sheets

MULTILEVEL CELL MEMORY ARCHITECTURE

This is a continuation of prior application Ser. No. 09/883,803, filed Jun. 18, 2001 now U.S. Pat. No. 6,483,743.

BACKGROUND

This invention relates generally to memory devices and particularly to memory devices with a multilevel cell architecture.

A multilevel cell memory is comprised of multilevel cells, each of which is able to store multiple charge states or levels. Each of the charge states is associated with a memory element bit pattern.

A flash EEPROM memory cell, as well as other types of memory cells, is configurable to store multiple threshold levels ($V_t$). In a memory cell capable of storing two bits per cell, for example, four threshold levels ($V_t$) are used. Consequently, two bits are designated for each threshold level.

In one embodiment, the multilevel cell may store four charge states. Level 3 maintains a higher charge than level 2, level 2 maintains a higher charge than level 1, and level 1 maintains a higher charge than level 0. A reference voltage may separate the various charge states. For example, a first voltage reference may separate level 3 and level 2, a second voltage reference may separate level 2 from level 1, and a third reference voltage may separate level 1 from level 0.

A multilevel cell memory is able to store more than one bit of data based upon the number of charge states. For example, a multilevel cell memory that can store four charge states can store two bits of data, a multilevel cell memory that can store eight charge states can store three bits of data, and a multilevel cell that can store sixteen charge states can store four bits of data. For each of the n-bit multilevel cell memories, various memory element bit patterns can be associated with each of the different charge states.

The number of charge states storable in a multilevel cell, however, is not limited to powers of two. For example, a multilevel cell with three charge states stores 1.5 bits of data. When this multilevel cell is combined with additional decoding logic and coupled to a second similar multilevel cell, three bits of data are provided as the output of the two-cell combination. Various other multi-cell combinations are also possible.

The retrieval of information from multilevel cell memories is currently slower than the retrieval from single-bit cell memories because the sensing time of multilevel cell memories is greater. This is primarily because sensing more than one bit takes more time than sensing one bit.

Generally, with conventional multilevel cell designs, a word may consist of a plurality of bits. A first set of two bits of the word may be stored in the same cell(in a 2 bit multilevel cell example) and then the next set of two bits may be stored in the same cell and so on to store the entire word. Then, to access to word, after decoding, both the first and second bits of the cell are sensed. Only when both bits have been sensed is the output accessible. In effect, then, the output must wait for both the first and the second bits to be sensed.

Thus, there is a need for a way to decrease access times for multilevel cell memories.

DETAILED DESCRIPTION

Figure 1:
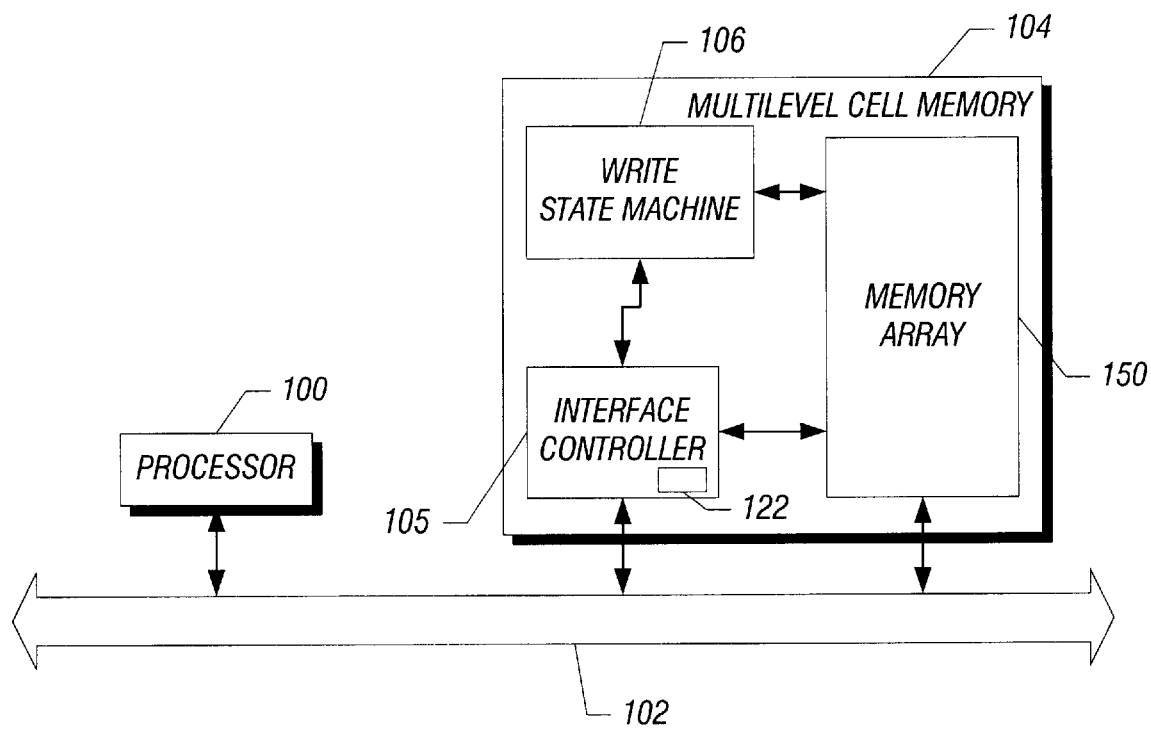
FIG. 1 is a block depiction of one embodiment of the present invention.

Referring to FIG. 1, a processor 100 may be coupled through a bus 102 to a multilevel cell memory 104. The memory 104 contains an interface controller 105, a write state machine 106 and a multilevel cell memory array 150. The processor 100 is coupled by the bus 102 to both the interface controller 105 and the memory array 150 in one embodiment of the present invention.

The processor 100 may be a general purpose processor or a digital signal processor, to mention two examples.

The interface controller 105 provides control over the multilevel cell memory array 150. The write state machine 106 communicates with the interface controller 105 and the memory array 150. The interface controller 105 passes data to be written into the array 150 to the state machine 106 and the state machine 106 executes the sequence of events to write data into the array 150. In one embodiment, the interface controller 105, the write state machine 106 and the multilevel cell memory array 150 are located on a single integrated circuit die.

Although embodiments are described in conjunction with a memory array 150 storing two bits per cell, any number of bits may be stored in a single cell, for example by increasing the number of threshold levels, without deviating from the spirit and scope of the present invention. Although embodiments of the present invention are described in conjunction with a memory array 150 of flash cells, other cells, such as read only memory (ROM), erasable programmable read only memory (EPROM), conventional electrically erasable programmable read only memory (EEPROM), or dynamic random access memory (DRAM), to mention a few examples, may be substituted without deviating from the spirit and the scope of the present invention.

Figure 2:
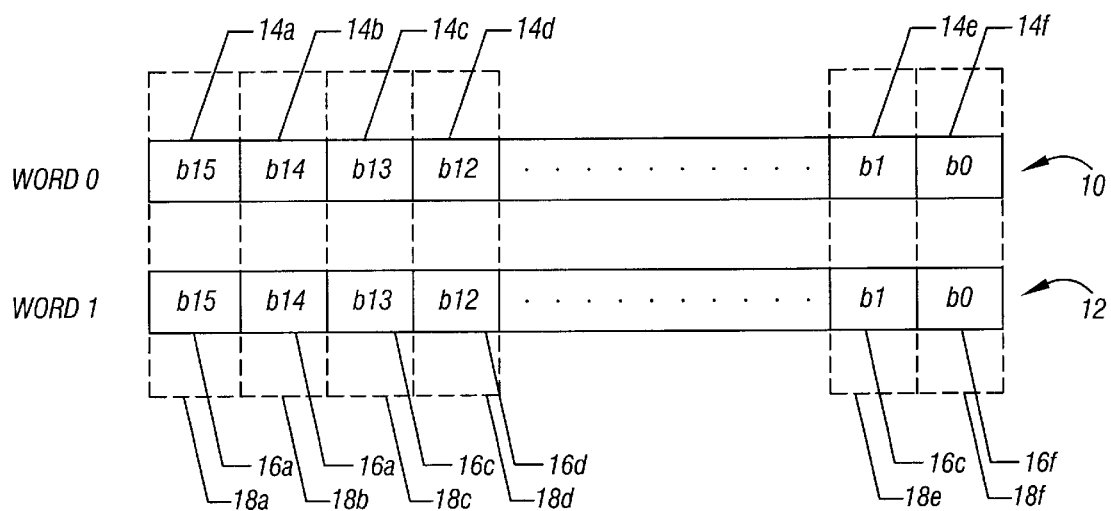
FIG. 2 is a schematic depiction of the memory architecture in accordance with one embodiment of the present invention.

Referring to FIG. 2, two words 10 and 12 stored in the memory array 150 include a plurality of bits 14 and 16, respectively. In the architecture depicted in FIG. 2, instead of placing adjacent bits within the same word in the same memory cell 18, adjacent bits 14 in the same word 10 or 12 are placed in different multilevel memory cells 18. For example, the bit 14a for the word 10 is stored with the bit 16a from the word 12 to form a cell 18a. Likewise, the other bits 14 of each word 10 or 12 are stored such that each memory cell 18 in the array 150 includes bits 14 from different words 10 or 12.

While in one embodiment to the present invention, one bit from each of two words is paired with one bit from the other of two words, a variety of other arrangements may be used. By placing bits from the same word in different cells, the access times of the memory array 150 may be improved relative to sensing both words before outputting either word.

Figure 3:
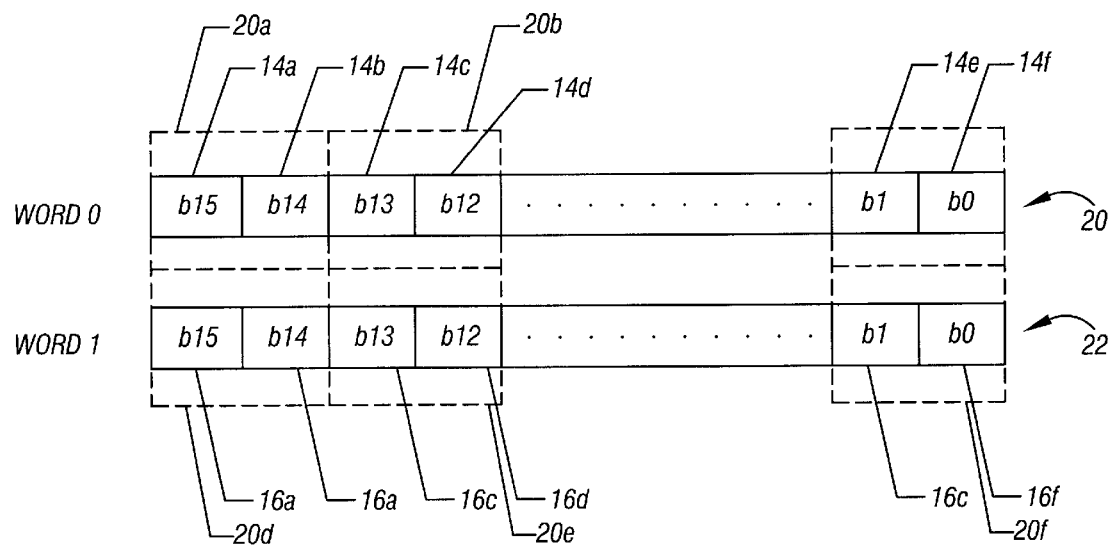
FIG. 3 is a schematic depiction of the memory architecture in accordance with the prior art.

Advantages of some embodiments of the present invention may be better understood by comparing the embodiment of FIG. 2 to a prior art architecture shown in FIG. 3. In FIG. 3, the words 20 and 22 have bits 14 and 16 as before. However, in accordance with the conventional approach, adjacent bits 14 or 16 in the same word 10 or 12 (such as the bits 14a and 14b) are stored in the same multilevel memory cell (e.g., the cell 20a).

As a result, in order to access information from the prior art memory array, it is necessary to first decode and then to successfully sense the first bit, such as the bit 14a. Next, it is necessary to successfully sense the second bit, such as the bit 14b, and finally to output the information. The access time for the cell 20 is the combination of the times to decode, to sense both the first and second bits and finally to output the sensed information.

In contrast with the embodiment shown in FIG. 2, the access time for the first word is a function of the decode time together with the time to sense the first bit plus the output time. In other words, the access time may be comparable to that of conventional single bit memories. The access time for the second word is a combination of the time to sense the second bit and the output time since no decoding is necessary the second time around.

Thus, the writing of the information into the array 150 may be controlled by hardware, for example, in the write state machine 106 and microcode stored therein, in one embodiment of the present invention. However, wholly software or wholly hardware based approaches may also be used.

In one embodiment, the sensing code 122 may initially cause the decoding to occur as indicated in block 24. Next, the first word is sensed as indicated in block 26. The first word is then outputted as indicated in block 28.

Next, the second word is sensed as indicated in block 30 and the second word is outputted as indicated in block 32. This sequence continues consistently with the architecture shown in FIG. 2.

Figure 4:
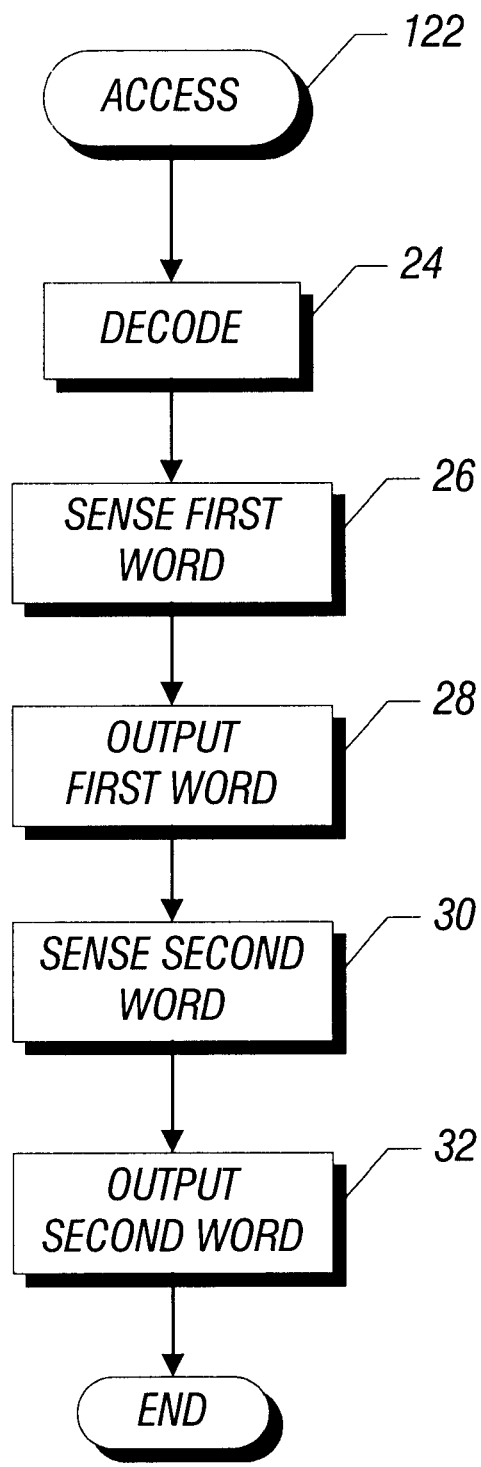
FIG. 4 is a flow chart in accordance with one embodiment of the present invention.
Figure 5:
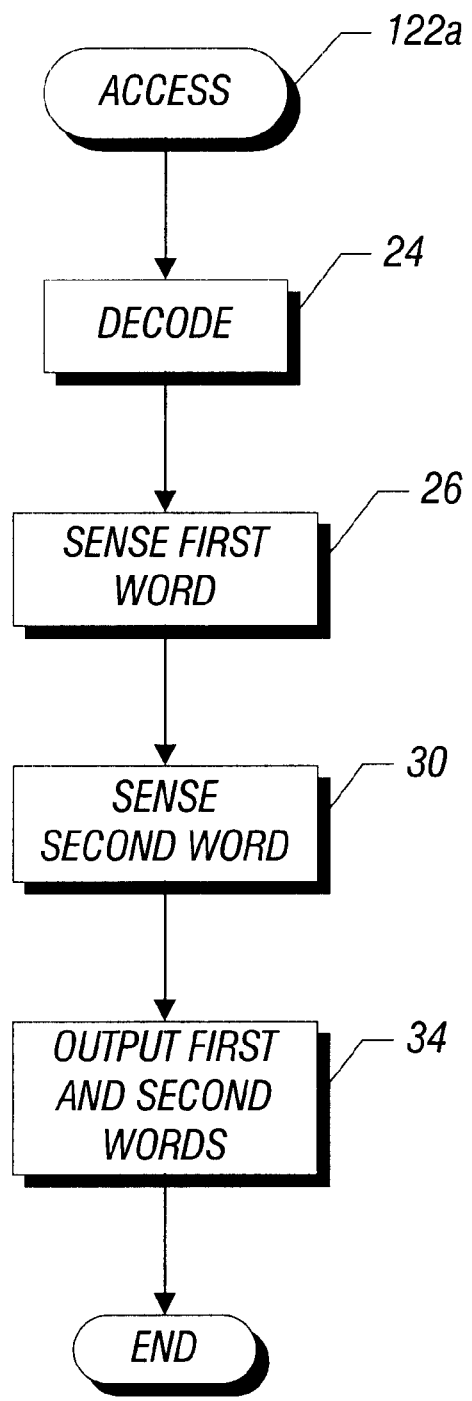
FIG. 5 is a flow chart in accordance with the prior art.

Referring to FIG. 5, the access code 122a in accordance with the prior art initially decodes as indicated in block 24 and then senses the first word as indicated in block 26. Then the prior art approach senses the second word as indicated in block 30 and finally outputs the first and second words as indicated in block 34 after sensing both the first and second words. Clearly the access time to the first word is significantly slower than with the technique illustrated for example in FIG. 4.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A system comprising:
   a digital signal processor; and
   a memory coupled to said processor including an array of multilevel memory cells, each of said multilevel memory cells to store at least two bits and at least one of said memory cells to store a first bit from a first word and a second bit from a second word.

2. The system of claim 1 including an interface controller and a write state machine.

3. The system of claim 2 wherein said write state machine executes a sequence of events to write data into said memory array such that bits from different words are stored in the same multilevel memory cell.

4. The system of claim 1 including a device to write data from two different words in the same memory cell.

* * * * *